(12) United States Patent
Vogel et al.

(10) Patent No.: US 7,897,961 B2
(45) Date of Patent: *Mar. 1, 2011

(54) REFLEX COUPLER WITH INTEGRATED ORGANIC LIGHT EMITTER

(75) Inventors: Uwe Vogel, Dresden (DE); Jörg Amelung, Dresden (DE); Gerd Bunk, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 504 days.

This patent is subject to a terminal disclaimer.

(21) Appl. No.: 11/847,472

(22) Filed: Aug. 30, 2007

(65) Prior Publication Data

US 2008/0054276 A1 Mar. 6, 2008

(30) Foreign Application Priority Data

Aug. 31, 2006 (DE) .......................... 10 2006 040 790

(51) Int. Cl.
*H01L 29/08* (2006.01)
(52) U.S. Cl. ..................... 257/40; 257/98; 257/E31.096; 257/E51.008
(58) Field of Classification Search ................. 257/40, 257/98, E31.096, E51.008
See application file for complete search history.

(56) References Cited

U.S. PATENT DOCUMENTS

| | | | |
|---|---|---|---|
| 7,626,207 B2 * | 12/2009 | Vogel et al. ................. | 257/82 |
| 2002/0074551 A1* | 6/2002 | Kimura ...................... | 257/72 |
| 2004/0027462 A1 | 2/2004 | Hing | |
| 2006/0091293 A1 | 5/2006 | Grueger et al. | |
| 2006/0197960 A1* | 9/2006 | Bazylenko ................. | 356/491 |
| 2009/0129724 A1* | 5/2009 | Carter et al. ............... | 385/14 |
| 2010/0012817 A1 | 1/2010 | Vogel et al. | |

FOREIGN PATENT DOCUMENTS

| | | |
|---|---|---|
| DE | 4027367 C1 | 7/1991 |
| DE | 102006030541 A1 | 12/2007 |
| WO | 2005/015173 A1 | 2/2005 |

OTHER PUBLICATIONS

Vogel et al. "Integrated Optocoupler with organic light emitter and inorganic photodetector," U.S. Appl. No. 11/840,266, filed Aug. 17, 2007.

* cited by examiner

*Primary Examiner* — Trung Dang
(74) *Attorney, Agent, or Firm* — Keating & Bennett, LLP

(57) ABSTRACT

A reflex coupler has an organic light emitter for generating a light signal and an inorganic photodetector with a detector area. The organic light emitter and the detector area are optically coupled as a result of radiation returned from an object onto which the light signal impinges, and the organic light emitter and the inorganic photodetector are integrated in one device.

18 Claims, 4 Drawing Sheets

(7a) (7b) (7c)

REFLEX COUPLER WITH INTEGRATED ORGANIC LIGHT EMITTER

CROSS-REFERENCE TO RELATED APPLICATIONS

This application claims priority from German Patent Application No. 10 2006 040 790.3, which was filed on Aug. 31, 2006, and is incorporated herein in its entirety by reference.

BACKGROUND OF THE INVENTION

1. Field of the Invention

The present invention relates to a reflex coupler with an integrated organic light emitter, and particularly to a monolithically integrated CMOS reflex coupler with OLED light source.

2. Description of the Related Art

Light barriers have become widespread as contactless technical means for acquiring status, geometry, position or state information. Among these are industrial applications, such as in the automobile industry, consumer electronics, medical and metrological technology. One embodiment of the light barriers is reflex light barriers in which transmitter and receiver are not arranged in opposite, but adjacent manner. Such a combination suggests an integrated arrangement of transmitter and receiver as closely as possible, monolithically on a common substrate, if possible, with their field of view facing in the same direction, if possible.

FIG. 9 shows a principle construction of a monolithically integrated reflex light barrier. Both a receiver 900 and a transmitter 905 are integrated in a substrate 910. In operation, the transmitter 905 emits a light signal 940, which is reflected from an object 950 and then detected by the receiver 900. As opposed to the conventional light barrier, a signal is only generated in an absence of the object 950 and/or upon reflection by the object 950.

Conventional integrated reflex light barriers are based on a CMOS (complementary metal oxide semiconductor) reception and evaluation chip, as well as an emitter of conventional (inorganic) light-emitting diodes. Both technologies utilize materials and processes different from each other. The CMOS technology mostly is based on monocrystalline silicon, while conventional light-emitting diodes mostly utilize monocrystalline III-V semiconductors. Thus, corresponding devices are not monolithic, but integratable with each other exclusively in hybrid manner.

Reflex couplers work according to the same principle as the reflex light barriers, i.e. the transmitter 905 and the receiver 900 are optically coupled to each other via a reflection of the light signal 940. In absence of the reflection, no coupling between the transmitter 905 and the receiver 900 is present. Reflex couplers thus may also serve as switches, i.e. electrical signals are passed on from one device to another device in absence of the reflection, wherein at the same time a galvanic separation of circuits is realized.

As light transmitters 905 in a reflex coupler, often light-emitting diodes (LEDs) are used, which emit infrared light or red light, and photodiodes, phototransistors, photothyristors, phototriacs, Schmitt phototriggers and Darlington phototransistors, for example, are used as light receiver or photodetector 900, i.e. the light receiver 900 generally comprises one or more pn junctions. The light transmitter 905 and the light receiver 900 are electrically insulated from each other. What is transmitted is continuous or alternating light, and the reflected light is assessed with respect to, maybe time-dependent, intensity, frequency, phase or wavelength.

Photodiodes as potential photodetectors 900 can be implemented in a standard CMOS process at various pn interfaces, and FIG. 10 shows an example implemented in a known n-well CMOS process. Here, a n-doped well (n well) 920 is formed in a p-doped substrate (p substrate) 910, said well comprising a $p^+$-doped layer 930 on the side facing away from the p substrate 910. As a final layer, the p substrate 910 comprises an oxide layer 940, and an ILD (inter-layer dielectric) layer 950, followed by an IMD (inter-metal dielectric) layer 960, is deposited. The oxide layer 940, the ILD layer 950 and the IMD layer 960, for example, comprise a dielectric material and are translucent. Various pn junctions are characterized by diodes 962, 964 and 975.

Incident light beams 990 create a charge carrier pair 985 of opposite polarity in the n well 920, which is separated according to the polarity and generates an electrical signal. The photodetector 900 thus is formed by the p substrate 910, the n well 920, the $p^+$-doped layer 930, as well as by the oxide layer 940. Necessary contacts for sensing the photodetector signal are not shown in FIG. 10 for reasons of clarity. FIG. 10 also shows a further photodiode 975, which is formed of a pn junction from the p substrate 910 and an $n^+$-doped surface layer 970. The light signals 980 represent reflected light at the surface layer 970.

Similar to reflex light barriers, fully integrated conventional reflex couplers are based on a CMOS reception chip as photodetector 900 and a CMOS evaluation chip as well as an emitter 905 of conventional (inorganic) light-emitting diodes. In conventional reflex couplers, both technologies also use materials and processes different from each other (CMOS: mostly silicon, LED: mostly III-V semiconductors) and thus are not monolithic, but only integratable with each other in hybrid manner.

Conventional light-emitting diodes of inorganic semiconductors, such as GaAs and related III-V semiconductors, have been known for decades. A basic principle of such light-emitting diodes is that, by applying an electrical voltage, electrons and holes are injected in a semiconductor and combine in radiating manner in a recombination zone under light emission. Nevertheless, light-emitting diodes on the basis of inorganic semiconductors also have significant disadvantages for many applications. A substantial disadvantage is, as already mentioned, that they are mostly applied only to III-V semiconductor backgrounds.

As an alternative to inorganic light-emitting diodes, light-emitting diodes on the basis of organic semiconductors have made great progress in the last few years. For example, organic electroluminescence is presently getting much attention as a medium suited for displays. Organic light-emitting diodes comprise an organic layer sequence with a thickness of typically around 100 nm, which is inserted between an anode and a cathode. Often, glass is used as a substrate, onto which a transparent, electrically conducting oxide is applied, such as indium tin oxide (ITO). Thereupon follows the organic layer sequence, which comprises hole-transporting material, emitting material and electron-transporting material. Then, mostly a metallic cathode follows.

In general, it is distinguished between organic light-emitting diode (OLEDs) as top emitters and OLEDs as bottom emitters. Typically, bottom emitters mainly emit the light signal 950 through the substrate, whereas top emitters emit in a direction away from the substrate.

FIG. 11 shows an organic light-emitting diode (OLED) 905, which is formed as a top emitter. Here, an electrode 925, an organic layer sequence 935 and a transparent electrode 945 are applied on a substrate 915. The contacting is done via a terminal 955 to the electrode 925, as well as via a terminal 965 to the transparent electrode 945. The substrate 915 mostly comprises non-transparent material and the electrode 925 a metal, for example. This results in the fact that, when applying a corresponding voltage at the terminal 955 and 965, a light signal 940 generated in the organic layer sequence 935 is emitted upward through the transparent electrode 945 (for example of ITO) in the type of illustration shown.

The light signal 940 in FIG. 11 indicates a main emission direction. Light generated in the organic layer sequence 935 does, however, also propagate along the organic layer sequence 935 or along the transparent electrode 945 and is also partially emitted laterally, as far as no lateral shielding is present.

Reflex couplers with inorganic emitter 905 (and detector 900) already are known. Organic light-emitting diode displays combined with an optical proximity switch and based on an organic emitter are already known. In DE 10244452 B4, such an optoelectronic switch used for a touch-sensitive (OLED) display is described.

As stated, since conventional LEDs predominantly use III-V semiconductors, and the detector circuit (i.e. the photodetector 900 and control circuit) is mostly based on silicon, both devices cannot be produced on the same substrate, and integration hence proves difficult. A possible hybrid integration in reflex couplers, such as it is known, in principle, necessitates a greater fabrication effort and does not allow for general price regression, especially in high numbers of pieces. Furthermore, due to the hybrid manner of construction, the reliability necessary for automobile applications only can be achieved at extremely high costs.

SUMMARY OF THE INVENTION

According to an embodiment, a reflex coupler may have: an organic light emitter for emitting a light signal; and an inorganic photodetector, which has a detector area, wherein the light emitter and the detector area can be coupled optically as a result of radiation returned from an object onto which the light signal impinges, and wherein the organic light emitter and the inorganic photodetector are integrated in one device.

The present invention is based on the finding that, by integration of an OLED emitter as top emitter on a largely structures CMOS substrate, a monolithic integration of a light source and a photodetector on a CMOS chip becomes possible. This integration may be done in a termination process or by means of so-called "post-processing". Structures of the CMOS construction may at the same time act as electrical insulator and lightguide. Photodiodes forming at pn barrier layers and thus being CMOS inherent, phototransistors or similar elements find application as photodetector. The organic light emitter and the inorganic photodetector may as such have a known construction.

OLEDs are advantageous since they allow for high integration in a production of reflex couplers and may also be deposited onto almost any substrates and may thus also particularly be integrated directly onto a silicon substrate. Moreover, a deposition may take place at relatively low temperatures (for example below 100° C.). Thus, OLEDs can be deposited onto a normal CMOS/BiCMOS circuit (BiCMOS=bipolar complementary metal oxide semiconductor), without there being any danger of damage. A present insulation oxide or an insulation layer on an integrated circuit (CMOS structure) may at the same time establish an optical connection, wherein a desired electrical insulation value may be adjusted via a layer thickness of the insulation layer. Thereby, this technology becomes very simple and inexpensive.

The integration of an OLED in the CMOS structure may be done as follows. An OLED as top emitter may, for example, utilize a usual CMOS metal layer as electrode, onto which the organic layer sequence is deposited and a transparent electrode is applied. A further CMOS oxide layer may, for example, serve as a substrate onto which the electrode is deposited. In the reflex coupler arrangement, the OLED emits a generated light signal upward (top emitter), i.e. away from the layer serving as the substrate, and hence mainly in the direction of a passivation. Depending on an object and/or the presence of an object, the light signal is reflected onto the photodetector.

The deposition of the OLED thus is technologically fully compatible with the CMOS BiCMOS technology and hence allows for the production of integrated OLED reflex couplers. Fabrication is possible without problem and in inexpensive manner even on large substrates (for example up to 200×200 mm).

Hence, the possibility to realize a reflex coupler in a monolithically integrated way arises. The photodetector may be formed as any light-sensitive device occurring in CMOS structures. As photodetector, not only the photodiodes already mentioned (such as shown in FIG. 11), but also phototransistors or similar structures having pn layers are possible.

In embodiments, apart from the emitter or light transmitter or detecting elements, such as the photodetector, control and evaluation electronics may be integrated in the CMOS chip. Such an arrangement may again be part of a complex integrated circuit, which, as a microsystem, additionally comprises a reflex coupler functionality.

In further embodiments, the geometric arrangement of the light transmitter and of the photodetector may be adapted to requirements of a measurement task. Here, the advantage of a possible large-area deposition and structuring capability of OLEDs comes into play. Moreover, it is to be noted that the area needed by the OLED may be utilized by an active circuit in the underground, which does not necessarily have to be linked to the OLED control. That is, the available part of the CMOS structure located below the OLED or opposite to the propagation of the emitted light signal may be used for other circuit elements.

In further embodiments, sensor geometries suited for specific applications can be realized. For example, the reflex coupler principle may also be applied for fluorescent sensor technology or also as a rain sensor. Here, further OLED emitters with various wavelengths may be applied, which excite a fluorescence of substances, and the corresponding fluorescent radiation, which mostly is emitted in another wavelength, may then be detected and its temporal decay behavior (i.e. the decreasing intensity) can be measured. Likewise, via the selection of further photodetectors, adapting the spectral sensitivity of the further photodetectors to the light emitter(s) is possible.

With the use of OLEDs as light emitters, there is the possibility of a monolithically integrated solution for reflex couplers, i.e. light generation and detection on a single substrate (e.g. on a silicon substrate). Thus, there are advantages with respect to a size of the devices and with respect to the possibility of the integration of new functions. OLEDs are easily and highly integratable. Moreover, they have high efficiency and low current consumption.

Further advantages of the organic electroluminescence are that, by the chemical variability, OLEDs may be produced in practically all colors, and that OLEDs can be applied to the most diverse substrates due to the deposition at low temperatures. With this, multi-channel solutions can be integrated on a chip, for example by using OLEDs emitting light in various color or wavelength.

The advantages of the reflex couplers with integrated OLED as compared with known hybrid solutions may be summarized as follows. In the monolithic integration of light source and photodetector on a CMOS chip, an emitter area may be structured geometrically almost arbitrarily, and various emitter wavelengths may be integrated in parallel. Also, it is advantageous that the emitter or transmitter area can be utilized for an underlying active circuit. The underlying active circuit may either be the control and evaluation electronics of the CMOS chip or also include control electronics for the OLED. This again leads to a significant reduction in chip area. With this, the effort in construction and connection technology (AVT; AVT=Aufbau-und Verbindungstechnik) for the integration of a hybrid solution is reduced and costs are decreased.

BRIEF DESCRIPTION OF THE DRAWINGS

Embodiments of the present invention will be detailed subsequently referring to the appended drawings, in which.

DETAILED DESCRIPTION OF PREFERRED EMBODIMENTS

Figure 1:
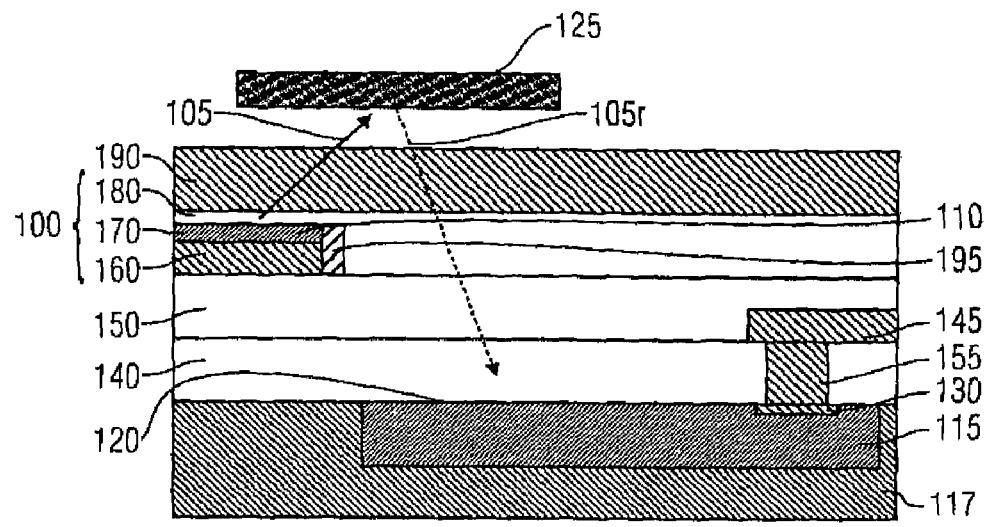
FIG. 1 is a cross-sectional view of a reflex coupler with an OLED and a photodiode.

Before the present invention will be explained on the basis of the drawings in the following, it is pointed to the fact that the same elements in the figures are provided with the same or similar reference numerals and that repeated description of these elements will be omitted.

FIG. 1 shows a cross-section through a CMOS-integrated reflex coupler construction with an OLED 100 as top emitter with a light-emitting surface 110 and a photodiode as photodetector 115. In this embodiment, a p substrate 117 comprises an n well 115, which is contacted via a connecting contact 130. On the p substrate 117 with the n well 115, a layer sequence with an ILD layer 140, followed by a first IMD layer 150, into which a first contact layer 145 is embedded, is deposited. The connecting contact 130 is connected to the first contact layer 145 via a bridge or via 145. The photodiode as photodetector 115 may, for example, be formed at a pn junction of the n well to the p substrate 117 or to a p$^+$-doped surface. It is, however, also possible that a pn junction of the p substrate to an n$^+$-doped surface or a further existing pn junction is used as photodetector 115.

On the layer sequence, a second contact layer 160 is deposited, which advantageously is part of a standard CMOS structure, just like the ILD layer 140, the IMD layer 160 and the first contact layer 145, which may e.g. be formed as a metal layer. According to the invention, the second contact layer 160 is opaque, comprises a metal, for example, and only partially covers the IMD layer 150. Onto the second contact layer 160, which serves as electrode of the OLED 100, an organic layer sequence 170 and a transparent conductor 180 are deposited such that the transparent conductor 180 and the second contact layer 160 are separated from each other. The transparent conductor 180 serves as transparent electrode of the OLED, and the first IMD layer 150 as substrate for the OLED 100. The OLED 100 thus includes the second contact layer 160, the organic layer sequence 170, and the transparent conductor 180. A transparent passivation layer 190 is provided for protection, and a lateral passivation 195 insulates the second contact layer 160 from the transparent conductor 180.

Figure 11:
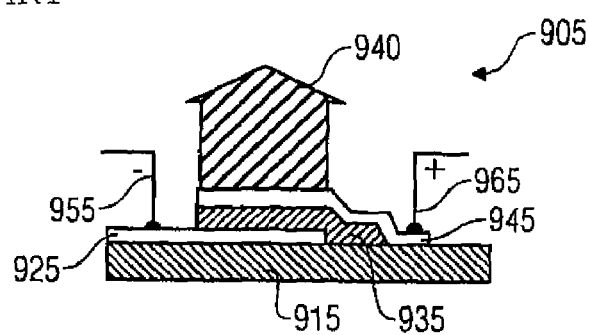
FIG. 11 is a cross-sectional view through a known organic light-emitting diode as top emitter.

By applying a voltage to the OLED 100 (a corresponding circuit is not illustrated in the figure), a light signal 105, which may be reflected by an object 125 and may pass the passivation layer 190, the transparent conductor 180, the first IMD layer 150 and the ILD layer 140 as reflected light signal 105r, is generated in the organic layer sequence 170. The object 125 usually does not represent a part of the inventive apparatus, but an external object 125. The reflected light signal 105r finally generates, in the n well 115, charge carrier pairs of opposite polarity (see FIG. 11), which finally provide an electric output signal. Of the signals necessary for tapping the output signal, only the contact layer 145 is shown in FIG. 1 for clarity reasons.

In one embodiment, it is to be taken care that the photodetector 115 not be obscured by the second metal layer 160, if possible, so that as large as possible a part of the reflected light signal 105r reaches the photodetector 115. So as to avoid misinterpretations, the passivation layer 190 and/or the transparent conductor 180 comprises a non-specular surface, if possible, so that the reflected light signal 105r originates from the object 125 and not from a layer boundary in the reflex coupler.

Figure 2:
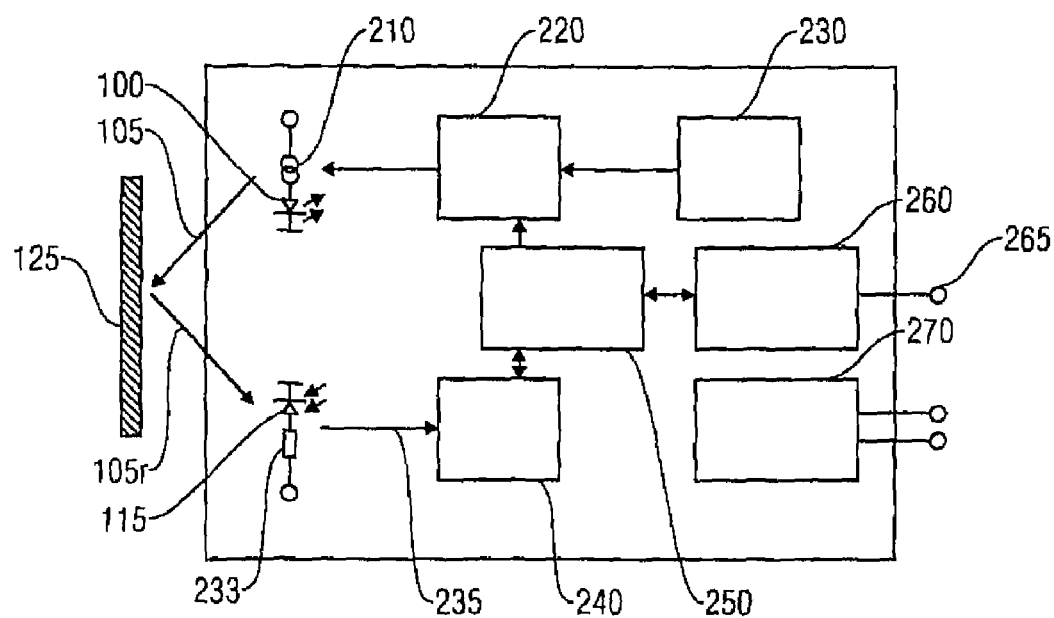
FIG. 2 is a principle circuit diagram with control and readout circuit blocks.

FIG. 2 shows a principle circuit diagram with possible control and/or readout circuit blocks as part of an integrated circuit for a reflex light barrier. Here, the OLED 100 is controlled via a current source 210, which is attached to a charge pump 230 by an OLED driver 220. The CMOS photodetector 115 is connected to a resistor 233 and an input amplifier 240. Moreover, an evaluation and control unit 250 is coupled to the OLED driver 220, the input amplifier 240, and to an output 265 via an interface 260. Finally, the integrated circuit comprises a current supply 270.

Based on a signal from the OLED driver 220, the OLED 100 generates a light signal 105, which is reflected from the object 125, so that the reflected light signal 105r impinges on the CMOS photodetector 115 and generates an output signal 235 there. For example, the output signal 235 is sensed in form of a voltage drop at the resistor 233 and output to the input amplifier 240. The evaluation and control unit 250 obtains the output signal 235 amplified by the input amplifier 240 on the one hand and at the same time controls the OLED driver 220. Thus, the evaluation and control unit 250 may effect a change in the control of the OLED 100 in case of a detection of the object 125. For example, this may include an increase in intensity or a change of a pulse rate of the light signal 105. The evaluation and control unit 250 also is connected to the output 265 via the interface 260, so that the detection of the object 125 may be indicated in form of a signal. The entire circuit is supplied with electrical voltage by the current supply 270.

Figure 3:
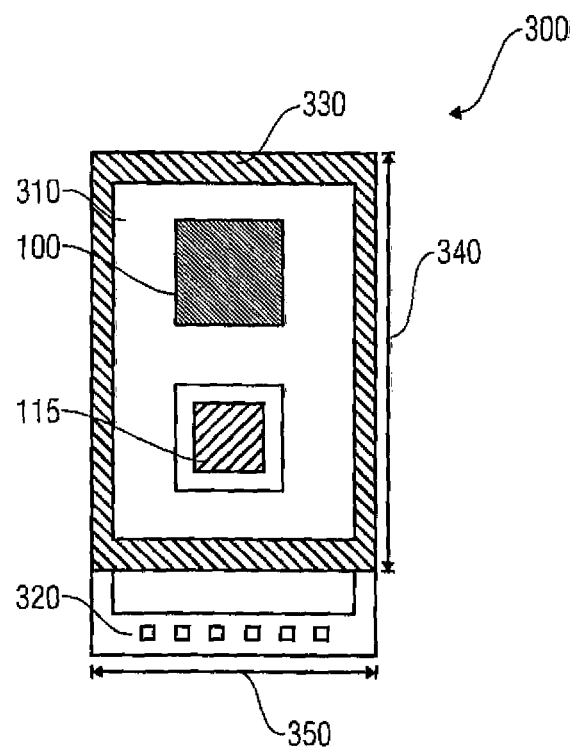
FIG. 3 is a top view with an OLED emitter and a photodetector on a chip.

FIG. 3 shows a top view onto a possible arrangement 300 for the OLED or OLED emitter 100 and the photodetector 115 on a chip. The photodetector 115 is embedded in a CMOS circuit 310, which also comprises the OLED 100 and which is contacted via a bond pad 320. The arrangement is bounded by an adhesive edge (lid) 330 and has a height 340 of 4 millimeters, for example, and a width 350 of 2 millimeters, for example.

The shape and size shown are only exemplary and generally are adapted to a specific task. Here, it is advantageous that OLEDs can be deposited and structured in large-area manner without problems. Moreover, the underground, i.e. the part below the OLED 100, may be used for a circuit. Apart from a simple detection of the object 125, the distance and/or a change in the distance of the object 125 from the photodetector 115 can be determined from an intensity and/or a change in intensity, respectively. For example, a decrease in distance may be deduced from an increase in intensity, and conversely an increasing distance from a decrease in intensity. Depending on further tasks, OLEDs of various colors may also be employed. In the following, several further specific examples will be given.

Figure 4:
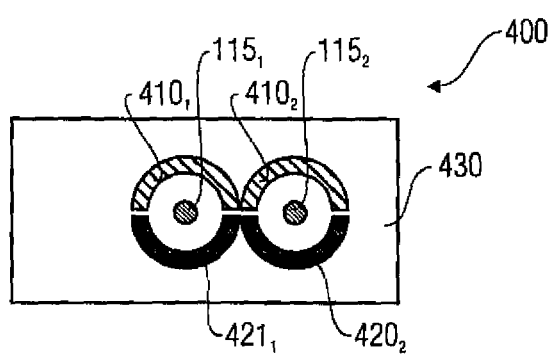
FIG. 4 is a top view onto a possible arrangement as a fluorescence sensor.

FIG. 4 shows a top view onto a possible sensor arrangement 400, which is particularly suited as a fluorescence sensor. The sensor arrangement 400 comprises two green OLEDs $410_1$ and $410_2$ as well as two blue OLEDs $420_1$ and $420_2$, which are part of a circuit 430. In this top view, two photodetectors $115_1$ and $115_2$ between the green OLEDs $410_1$ and $410_2$ as well as the blue OLEDs $420_1$ and $420_2$ are arranged so that the green OLEDs $410_1$ and $410_2$ as well as the blue OLEDs $420_1$ and $420_2$ ideally are at the same distance to the photodetectors $115_1$ and $115_2$. In further embodiments, even further OLEDs and/or photodetectors may be provided. Likewise, combinations with further colors and/or a use of OLEDs of other color are possible. Here, it proves to be advantageous, however, that the various OLEDs have, if possible, the same distance to the photodetectors $115_1$ and $115_2$ in further variants. By various colors, a fluorescence of substances may be excited, and the corresponding fluorescence radiation, which mostly is emitted in another wavelength, can be detected and its temporal decay behavior (i.e. the decreasing intensity) can be measured. Thus, the relevant substances can be verified on the basis of the fluorescence. Here, it is advantageous if the photodetectors $115_1$ and $115_2$ have increased sensitivity for the corresponding radiation caused by fluorescence.

Figure 5:
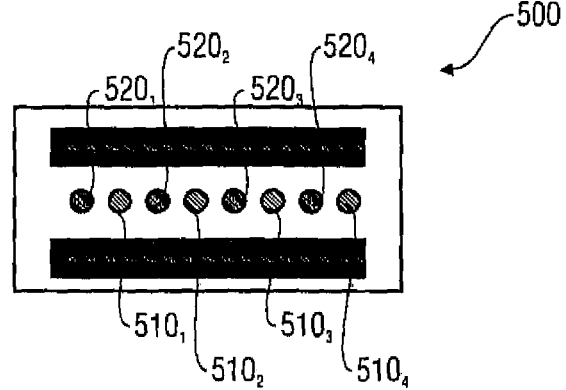
FIG. 5 is a top view onto a possible arrangement as flowmetry sensor.

FIG. 5 shows a top view onto a sensor arrangement 500, which is particularly suited as a flowmetry sensor. In this embodiment, a series of photodetectors $5101_1$, $510_2$, $510_3$ . . . and $520_1$, $520_2$, $520_3$ . . . , which may have different spectral sensitivity, are arranged between two OLED emitters $100_1$ and $100_2$ arranged in beam shape. In a specific embodiment, the photodetectors $510_1$, $510_2$, $510_3$ . . . are all connected in parallel and thus electrically form a unit. In the same way, the photodetectors $520_1$, $520_2$, $520_3$ . . . are electrically connected in parallel and also electrically form a unit. Optically, the respective photodetectors, however, do not form a unit, and a moving object 125 will generate a pulse signal with a frequency proportional to a velocity of the object 125.

By evaluating the time instants at which the photodetectors detect reflected signals, for example, movement of an object 125 or of various objects can be detected. Photodetectors with different spectral sensitivity, i.e. the photodetectors $510_1$, $510_2$, $510_3$ . . . and $520_1$, $520_2$, $520_3$ . . . in FIG. 5, may prove to be advantageous to distinguish among various objects (for example having a different reflection spectrum) and detect their movement. On the other hand, a sensitivity may be used in a further channel or in a further color as a control measurement and thus increase the reliability of the sensor.

Figure 6:
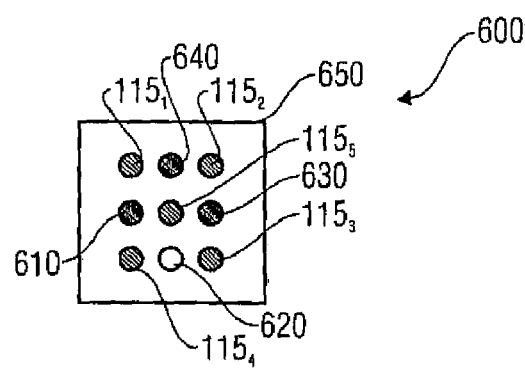
FIG. 6 is a top view onto a possible arrangement for a spectral or color sensor.

FIG. 6 shows a top view onto a sensor arrangement 600, which is particularly suited as potential spectral/color sensor. This embodiment comprises four different OLEDs. A blue OLED 610, a green OLED 620, a red OLED 630 and a (near) infrared OLED 640 are arranged together with photodetectors $115_1$, $115_2$, $115_3$, . . . on a chip 650, which has a rectangular shape in the embodiment. Here, the photodetectors $115_1$, $115_2$, $115_3$, . . . are arranged symmetrically on the chip 650, namely one photodetector each at each corner and at the center. The OLEDs of different color are arranged along the four sides of the chip 650, wherein the blue OLED 610 is arranged on the left, the green OLED 620 at the bottom, the red OLED 630 on the right and the (near) infrared OLED 640 at the top in the top view shown here.

The choice of the arrangement of the OLEDs as well as the coloring is done freely, and the OLEDs may be exchanged correspondingly in further embodiments. Likewise, the number of the OLEDs and their color, as well as the rectangular shape of the chip 650 are only exemplary and may vary in further embodiments. It is, however, advantageous if the photodetectors $115_1$, $115_2$, $115_3$, . . . are arranged as closely as possible to the various OLEDs, in order to obtain a similar spectral sensitivity for all colors. Here, an interference as a result of too small a distance should, however, be excluded. This embodiment may be used as a color sensor, i.e. various reflection properties of colored objects or substances with respect to color light may be detected in targeted manner, and thus objects or substances may be distinguished according to their color. For this application, it is particularly advantageous that OLEDs are available in many colors.

Figure 7:
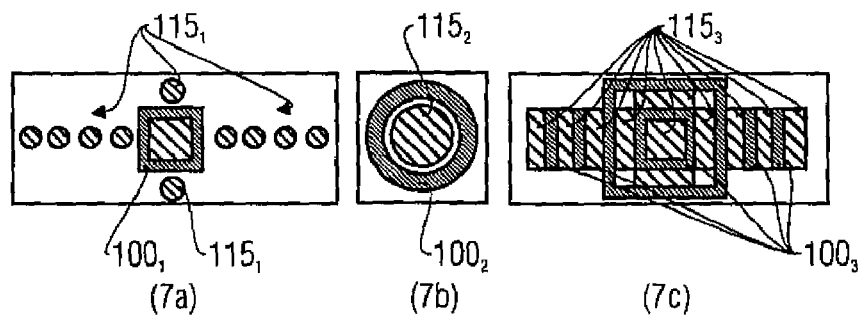
FIGS. 7a, 7b, 7c show a top view onto three possible arrangements for optical function diagnostics.

FIGS. 7a, 7b and 7c show possible sensor arrangements 700 for optical function diagnostics, such as photoplethysmography. Here, the dashed regions are photodetectors $115_1$, $115_2$, $115_3$, and the dark regions are OLEDs $100_1$, $100_2$, $100_3$, which may measure various functions due to their arrangements. Among these are, for example, measurements of flow properties with reference to amount and flow velocity of liquids and/or frequencies of pulsating liquids (for example blood). Using various colors, it is also possible to determine certain proportions of a liquid (for example a fluorescent proportion in a certain color) in targeted manner and detect their movement. The intensity of the detected radiation may thus also give an indication of a concentration of this proportion. FIG. 7b shows a round reflex coupler arrangement, and in the arrangement of 7a (and similarly in FIG. 7c) several photodiodes at increasing pitch detect light from an object 125 at various distances.

Figure 8:
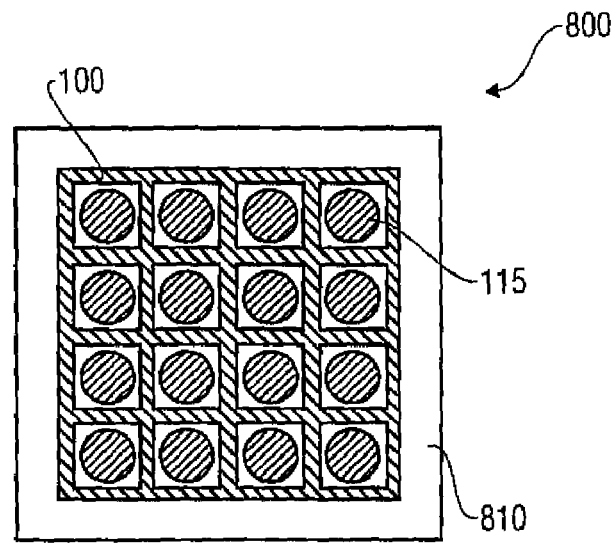
FIG. 8 is a top view onto a possible sensor arrangement for a so-called lab-on-chip application.
Figure 9:
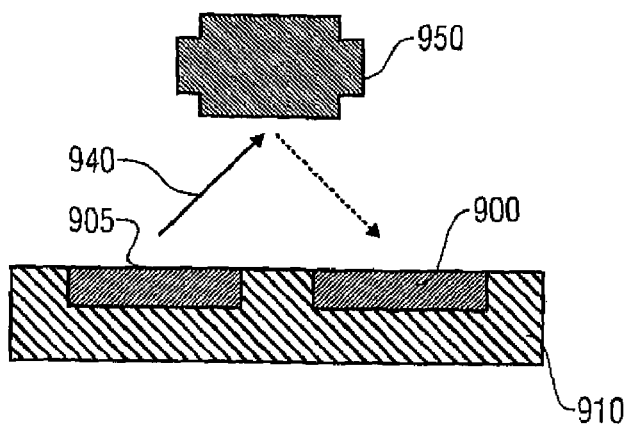
FIG. 9 is a principle illustration for a reflex coupler.
Figure 10:
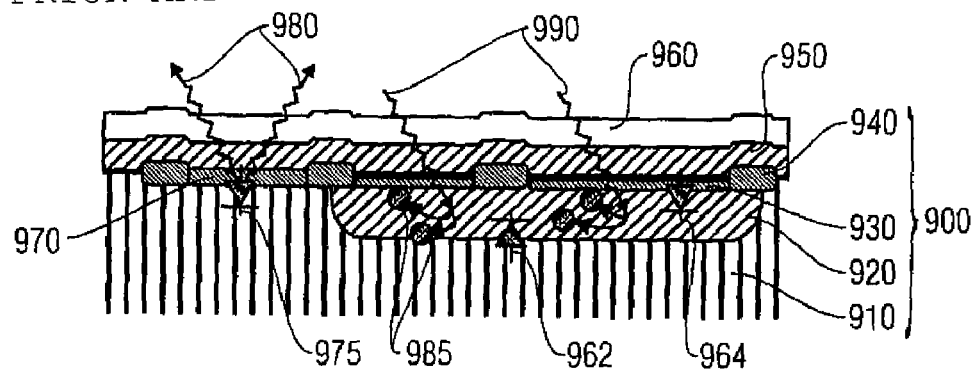
FIG. 10 is a cross-sectional view through a photodiode in the known standard n-well CMOS process.

FIG. 8 shows a top view for a possible sensor arrangement 800, which is suited for a lab-on-chip application. On a chip 810, an OLED 100, which is formed in grid-shaped manner, and photodetectors (dashed regions) 115 are in the respective gaps. Again, it is possible to determine certain proportions of a liquid (for example a fluorescent proportion in a certain color) in targeted manner and/or detect their movement or change, using various colors. In further embodiments, the OLED arranged in grid-shaped manner is constructed of a multiplicity of OLEDs formed in beam or line-shaped manner. Thereby, in this sensor arrangement, also a position of certain substances or objects on the chip may be determined. By suitable OLEDs, which excite certain substances or components of liquids, also concentrations of the certain substance depending on the position on the chip can be determined with this sensor arrangement. Likewise, a detection of temporal changes (e.g. of the concentration of a fluorescent substance) is possible.

The embodiments of the present invention described with reference to the figures may, of course, also be combined and/or expanded. For example, in the reflex coupler, focusing the light signal 105 may be done via optics. This may, for example, be achieved by a lens or by a mirror system and would be advantageous in that the detector area 120 of the photodetector 115 can be chosen correspondingly smaller, nevertheless obtaining a sufficient amount of light.

In operation, the reflex coupler may use both analog and digitized signals. So as to be able to suppress external spurious effects for example of extraneous light in effective manner, it may be advantageous to use a fixed clocking or modulation.

The described embodiments for reflex couplers with integrated OLED offer the advantages already mentioned previously. These advantages included, in particular, a reduction in effort of construction and connection technology (AVT) for the integration and in costs. Moreover, the monolithic integration of light source, electrical insulator, lightguide and photodetector on a chip is easy to realize. Furthermore, standard CMOS layers/structures may be utilized as electrical insulator and lightguide. Thus, an improvement in insulation strength arises when using an SOI CMOS substrate, as well as a reduction in chip area. Finally, embodiments of the present invention offer the possibility of complex integration of a control circuit for the light emitter and readout electronics for the photodetector.

Various aspects of the present invention thus may finally be stated as follows:
  spatial co-integration of organic emitter and CMOS photodetector on a CMOS silicon chip in an arrangement as reflex coupler;
  use of CMOS pn junctions (e.g. well substrate, well contact and the like) as photodetectors;
  arrangement of the OLED emitter as top emitter emitting indirectly onto the photodetector;
  modulation of the light source for spurious and extraneous light suppression;
  monolithic implementation in a complex integrated circuit for the—maybe multi-channel or one- or multi-dimensional array shape—arrangement of reflex couplers, e.g. with the aim of object recognition, spurious decoupling or the like;
  an optical element assembled into the encapsulation of the OLED (lenses or diffractive elements) so as to enable light steering;
  use of OLED emitters with various wavelengths;
  application as reflex light barrier;
  application in the fluorescence sensor technology;
  application in the flowmetry by an arrangement;
  application in optical function diagnostics (e.g. photoplethysmography) by an arrangement;
  application as spectral sensor (e.g. surface color sensor) by an arrangement;
  application as lab-on-chip sensor by an arrangement;
  application as rain sensor.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A reflex coupler, comprising:
  an organic light emitter arranged to emit a light signal; and
  an inorganic photodetector which comprises a detector area; wherein
  the light emitter and the detector area can be coupled optically as a result of radiation returned from an object onto which the light signal impinges, and the organic light emitter and the inorganic photodetector are integrated in one device;
  the reflex coupler includes further organic light emitters and/or further inorganic photodetectors;
  the further organic light emitters and/or the further inorganic photodetectors are arranged across an area or along a direction, and the inorganic photodetector and the further inorganic photodetectors are arranged so as to be able to independently detect reflections on the object or on further objects; and
  the inorganic photodetector and the further inorganic photodetectors are arranged in at least one direction; and
  the reflex coupler includes an evaluating unit which is arranged so that a relative movement of the object to several of the inorganic photodetector and the further inorganic photodetectors in the at least one direction can be determined and a velocity of the object can be determined from a pulse frequency of an output signal.

2. The reflex coupler according to claim 1, wherein the inorganic photodetector comprises doped semiconductor material with at least one pn junction.

3. The reflex coupler according to claim 1, wherein the organic light emitter comprises an organic light-emitting diode.

4. The reflex coupler according to claim 1, further comprising a dielectric transparent layer sequence on the side of the detector area facing the object, and wherein at least parts of control electronics for the organic light emitter and/or control and/or evaluation electronics for the inorganic light emitter is arranged in and/or below the dielectric transparent layer sequence.

5. The reflex coupler according to claim 1, comprising control electronics controlling the organic light emitter such that the light signal comprises modulation to suppress potential extraneous light influences.

6. The reflex coupler according to claim 1, wherein the further organic light emitters generate further light signals, and the further light signals comprise another frequency than the light signal and/or the further inorganic photodetectors comprise another wavelength sensitivity than the inorganic photodetector.

7. The reflex coupler according to claim 1, wherein the inorganic photodetector is arranged to verify light reflected from the object or light as a result of fluorescence of a substance.

8. The reflex coupler according to claim 7, wherein control electronics of the inorganic photodetector is arranged to detect a temporal decay behavior of the light as a result of the fluorescence.

9. The reflex coupler according to claim 1, wherein the inorganic photodetector is arranged to detect a change in incident light intensity, and the evaluating unit is arranged so that the relative movement is determined from the change in the incident light intensity.

10. The reflex coupler according to claim 1, wherein the evaluating unit is arranqed so that shape recognition and/or shape change of the object can be determined.

11. The reflex coupler according to claim 1, comprising an optical element for steering and/or focusing the light signal.

12. The reflex coupler according to claim 11, wherein the optical element comprises a lens and/or a diffractive element.

13. The reflex coupler according to claim 11, wherein the organic light emitter comprises an encapsulation, and the encapsulation comprises the optical element.

14. The reflex coupler according to claim 1, wherein components of the inorganic photodetector and/or components for operating the organic light emitter are used in CMOS, BiCMOS or bipolar technology.

15. Use of a reflex coupler according to claim 1 as reflex light barrier, as fluorescence sensor, as flowmetry sensor, as sensor for optical function diagnostics, as spectral sensor, as lab-on-chip sensor or as rain sensor.

16. A reflex coupler, comprising:
a plurality of organic light emitters arranged to emit a light signal; and
a plurality of inorganic photodetectors, each of which comprises a detector area; wherein
the plurality of organic light emitters and the detector areas can be coupled optically as a result of radiation returned from an object onto which the light signal impinges, and the plurality of organic light emitters and the plurality of inorganic photodetectors are integrated in one device;
the plurality of inorganic photodetectors includes at least two inorganic photodetectors and the plurality of organic light emitters includes at least four semi-annular organic light emitters;
two of the at least four semi-annular organic light emitters are arranged to define a ring; and one of the plurality of inorganic photodetectors is arranged in the approximate center of the ring.

17. A reflex coupler, comprising:
a plurality of organic light emitters arranged to emit a light signal; and
a plurality of inorganic photodetectors, each of which comprises a detector area; wherein
the plurality of organic light emitters and the detector areas can be coupled optically as a result of radiation returned from an object onto which the light signal impinges, and the plurality of organic light emitters and the plurality of inorganic photodetectors are integrated in one device; and
the plurality of inorganic photodetectors and the plurality of organic light emitters are arranged in rows and columns such that the plurality of inorganic photodetectors and the plurality of light emitters are alternately arranged in the rows and columns.

18. A reflex coupler, comprising:
an organic light emitter arranged to emit a light signal; and
an inorganic photodetector which comprises a detector area; wherein
the light emitter and the detector area can be coupled optically as a result of radiation returned from an object onto which the light signal impinges, and the organic light emitter and the inorganic photodetector are integrated in one device; and
the organic light emitter is arranged to completely surround the inorganic photodetector.

* * * * *

UNITED STATES PATENT AND TRADEMARK OFFICE
CERTIFICATE OF CORRECTION

| | |
|---|---|
| PATENT NO. | : 7,897,961 B2 |
| APPLICATION NO. | : 11/847472 |
| DATED | : March 1, 2011 |
| INVENTOR(S) | : Uwe Vogel et al. |

It is certified that error appears in the above-identified patent and that said Letters Patent is hereby corrected as shown below:

Col. 10, claim 4 should read:

4. The reflex coupler according to claim 1, further comprising a dielectric transparent layer sequence on the side of the detector area facing the object, and wherein at least parts of control electronics for the organic light emitter and/or control and/or evaluation electronics for the organic light emitter is arranged in and/or below the dielectric transparent layer sequence.

Signed and Sealed this
Ninth Day of August, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,897,961 B2 | Page 1 of 1 |
| APPLICATION NO. | : 11/847472 | |
| DATED | : March 1, 2011 | |
| INVENTOR(S) | : Uwe Vogel et al. | |

It is certified that error appears in the above-identified patent and that said Letters Patent is hereby corrected as shown below:

Col. 10, lines 38-43 claim 4 should read:

4. The reflex coupler according to claim 1, further comprising a dielectric transparent layer sequence on the side of the detector area facing the object, and wherein at least parts of control electronics for the organic light emitter and/or control and/or evaluation electronics for the organic light emitter is arranged in and/or below the dielectric transparent layer sequence.

This certificate supersedes the Certificate of Correction issued August 9, 2011.

Signed and Sealed this
Thirtieth Day of August, 2011

David J. Kappos
*Director of the United States Patent and Trademark Office*